United States Patent
Belitzer et al.

(10) Patent No.: US 8,890,635 B2
(45) Date of Patent: Nov. 18, 2014

(54) SIGNAL GENERATOR FOR A TRANSMITTER OR A RECEIVER, A TRANSMITTER AND A RECEIVER

(75) Inventors: Alexander Belitzer, Munich (DE); Andre Hanke, Unterhaching (DE); Boris Kapfelsperger, Igling (DE); Volker Thomas, Gilching (DE); Elmar Wagner, Taufkirchen (DE)

(73) Assignee: Intel Mobile Communications GmbH, Neubiberg (DE)

( * ) Notice: Subject to any disclaimer, the term of this patent is extended or adjusted under 35 U.S.C. 154(b) by 860 days.

(21) Appl. No.: 13/019,358

(22) Filed: Feb. 2, 2011

(65) Prior Publication Data

US 2012/0195239 A1    Aug. 2, 2012

(51) Int. Cl.
- H03L 7/06        (2006.01)
- H03C 3/06        (2006.01)
- H03L 7/099       (2006.01)
- H04B 1/40        (2006.01)

(52) U.S. Cl.
CPC ............ *H04B 1/403* (2013.01); *H03L 2207/06* (2013.01); *H03L 7/099* (2013.01)
USPC ........... 332/127; 332/117; 332/128; 455/260; 331/16; 331/34; 331/177 V; 331/176; 375/376; 375/316; 375/327; 329/320; 329/315

(58) Field of Classification Search
CPC .................................... H03L 7/06; H03L 7/18
USPC .................. 455/260; 331/16, 34, 177 V, 176; 375/376, 316, 327; 332/128, 127, 117; 329/320, 315
See application file for complete search history.

(56) References Cited

U.S. PATENT DOCUMENTS

| | | | |
|---|---|---|---|
| 6,268,780 B1 | 7/2001 | Olgaard et al. | |
| 7,323,944 B2 * | 1/2008 | Florescu et al. | 331/14 |
| 7,349,680 B2 * | 3/2008 | Ibrahim et al. | 455/260 |
| 7,439,817 B2 * | 10/2008 | Waheed et al. | 331/16 |
| 7,714,665 B2 * | 5/2010 | Waheed et al. | 331/16 |
| 2006/0226916 A1 | 10/2006 | Florescu et al. | |

OTHER PUBLICATIONS

Chinese Office Action dated Sep. 9, 2014 in connection with Chinese Patent Application No. 201210023141.6.

* cited by examiner

*Primary Examiner* — Arnold Kinkead
(74) *Attorney, Agent, or Firm* — Eschweiler & Associates, LLC

(57) ABSTRACT

A signal generator for a transmitter or a receiver for transmitting or receiving RF-signals according to a given communication protocol includes an oscillator and a mismatch compensator. The oscillator is configured to provide a signal generator output signal having a signal generator output frequency and comprises a fine tuning circuit for providing a fine adjustment of the signal generator output frequency based on a fine tuning signal and a coarse tuning circuit for providing a course adjustment of the signal generator output frequency based on a coarse tuning signal. The mismatch compensator is configured to receive the signal generator output signal and compensate a frequency mismatch between a desired signal generator output frequency and the signal generator output frequency generated by the oscillator by providing the fine tuning signal for changing the state of the fine tuning circuit of the oscillator and by providing the coarse tuning signal for changing a state of the coarse tuning circuit of the oscillator. The mismatch compensator provides the coarse tuning signal during a guard period defined in the given communication protocol, during which no RF-signals are transmitted by the transmitter or no RF-signals are to be received by the receiver, such that the state of the coarse tuning circuit is changed within the guard period.

25 Claims, 6 Drawing Sheets

US 8,890,635 B2

SIGNAL GENERATOR FOR A TRANSMITTER OR A RECEIVER, A TRANSMITTER AND A RECEIVER

FIELD

Embodiments are directed to a signal generator for a transmitter or a receiver for transmitting or receiving RE-signals according to a given communication protocol, for example, according to a UMTS or LTE protocol. Further embodiments are directed to a transmitter for transmitting RF-signals according to a given communication protocol. Further embodiments are directed to a receiver for receiving RF-signals according to a given communication protocol. Further embodiments are directed to a method for generating a signal generator output signal.

BACKGROUND

In a continuous time operating system (such as the UMTS network), where a communication link is potentially maintained for a longer period of time without a break, temperature effects become difficult to handle. One of the effects is the thermal drift of the oscillation frequency of the frequency synthesizer.

SUMMARY

Embodiments comprise a signal generator for a transmitter or a receiver for transmitting or receiving RF-signals according to a given communication protocol. The signal generator comprises an oscillator for providing a signal generator output signal having a signal generator output frequency. The oscillator comprises a fine tuning circuit for providing a fine adjustment of the signal generator output frequency based on a fine tuning signal and a coarse tuning circuit for providing a coarse adjustment of the signal generator output frequency based on a coarse tuning signal.

The signal generator further comprises a mismatch compensator configured to receive the signal generator output signal and compensate a frequency mismatch between a desired signal generator output frequency and the signal generator output frequency generated by the oscillator. The compensation includes providing the fine tuning signal for changing a state of the fine tuning circuit of the oscillator and providing the coarse tuning signal for changing a state of the coarse tuning circuit of the oscillator. The mismatch compensator is further configured to provide the coarse tuning signal during a guard period defined in the given communication protocol, during which no RF-signals are transmitted by the transmitter or no RF-signals are to be received by the receiver, such that the state of the coarse tuning circuit is changed within the guard period.

BRIEF DESCRIPTION OF THE DRAWINGS

Embodiments will be described in detail using the accompanying figures, wherein.

Before embodiments are described in greater detail, it is pointed out that the same element or elements with the same functions are provided with the same reference numbers and that a repeated description of elements provided with the same reference numbers is omitted. Therefore, descriptions of elements provided with the same reference numbers are mutually interchangeable.

DETAILED DESCRIPTION

Figure 1:
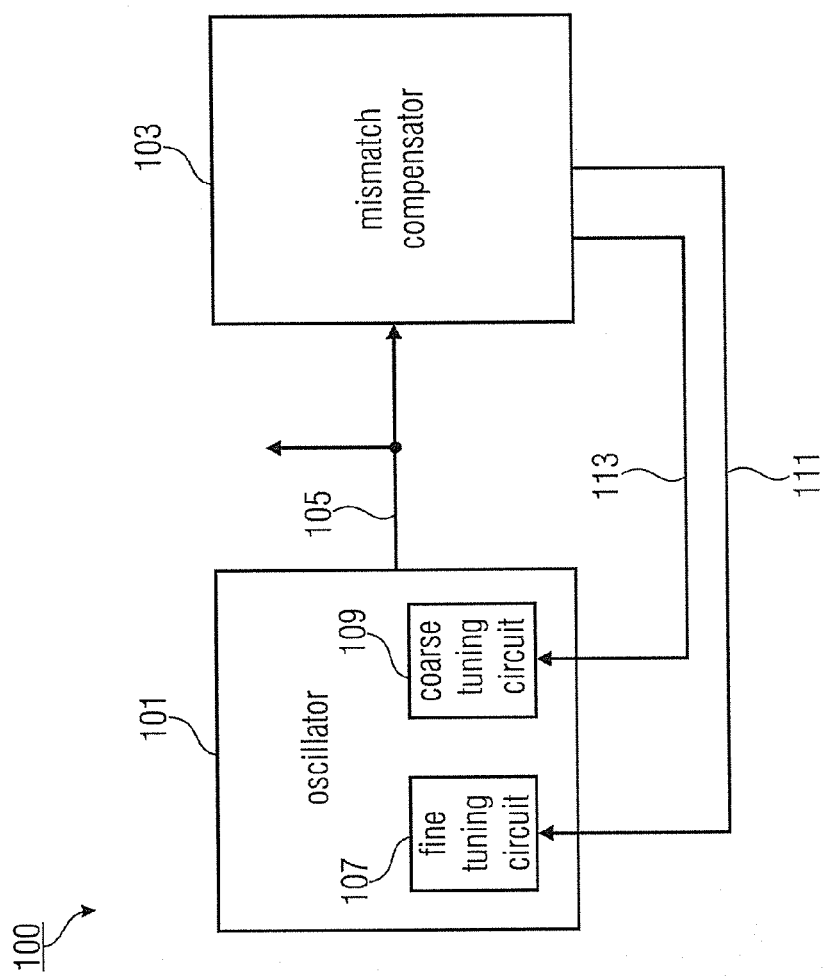
FIG. 1 shows a block schematic diagram of a signal generator according to an embodiment.

FIG. 1 shows a block schematic diagram of a signal generator 100 for a transmitter of a receiver for transmitting or receiving RF-signals (Radio Frequency signals) according to a given communication protocol, for example, according to a UMTS (universal mobile telecommunication standard) protocol or according to a LTE (long term evolution) protocol.

The signal generator 100 comprises an oscillator 101 and a mismatch compensator 103.

The oscillator 101 is configured to provide a signal generator output signal 105 having a signal generator output frequency. The oscillator 101 comprises a fine tuning circuit 107 and a coarse tuning circuit 109. The fine tuning circuit 107 is configured to provide a fine adjustment of the signal generator output frequency of the signal generator output signal 105 based on a fine tuning signal 111. The coarse tuning circuit 109 is configured to provide a coarse adjustment of the signal generator output frequency of the signal generator output signal 105 based on a coarse tuning signal 113.

The mismatch compensator 103 is configured to receive the signal generator output signal 105 and compensate for a frequency mismatch between a desired signal generator output frequency (a target frequency) and the signal generator output frequency of the signal generator output signal 105 (currently) generated by the oscillator 101 by providing the fine tuning signal 111 for changing a state of the fine tuning circuit 107 and by providing the coarse tuning signal 113 for changing a state of the coarse tuning circuit 109. The mismatch compensator 103 is configured to provide the coarse tuning signal 113 during a guard period (or a guard interval) defined in the given communication protocol, during which no RF-signals are transmitted by the transmitter (in which the signal generator 100 is employed) or no RF-signals are to be received by the receiver (in which the signal generator 100 is employed), such that the state of the coarse tuning circuit 109 is changed within the guard period.

For example, the signal generator 100 may be used as a frequency synthesizer for generating the signal generator output signal as a transmit synthesizer signal in the transmitter or for generating the signal generator output signal as a receiver synthesizer signal in the receiver.

In continuous time operating systems temperature effects become difficult to handle because a communication link is potentially maintained for a longer period of time without a break, for example, a transmitter continuously transmits RF-signals and a receiver continuously receives RE-signals. If, during this time, a temperature of the transmitter or the receiver changes, an oscillation frequency of the frequency synthesizer of the transmitter or the receiver, which is used for modulating or demodulating the transmitted or received RF-signals, can change because of thermal drifts. Compared to TDM systems (TDM—time division multiplexor), like GSM in which receive or transmit bursts are used in such continuous time operating systems, the possibilities of compensating for the thermal drifts of the oscillation frequency of the frequency synthesizer are very limited, as there are nearly no times in which the transmitter is not active or the receiver is not active. Therefore, during the active phase of the transmitter or receiver only small frequency changes are allowed which, especially in cases of a high temperature difference, may lead to a large mismatch between the oscillation frequency of the frequency synthesizer and a desired oscillation frequency.

A temperature range of an oscillator (or in general of a signal generator) can be extended if the oscillator comprises a fine tuning circuit and a coarse tuning circuit for compensating a frequency mismatch between a desired signal generator output frequency and a signal generator output frequency generated by the oscillator and if the coarse tuning signal is provided during a guard period, during which no RF-signals are transmitted or no RF-signals are to be received.

It has been found that a synthesizer signal (e.g. the signal generator output signal 105 generated by the signal generator 100) for a transmitter or receiver is not used during such guard periods, as in this guard periods no RF-signals are transmitted (and, therefore, no modulation signal for modulating the RF-signals is needed) and no RF-signals are to be received (and, therefore, no demodulation signal for demodulating the RF-signals are needed) and that this guard period can be used for providing a coarse tuning of the synthesizer signal (e.g. of the signal generator output frequency of the signal generator output signal 105).

By providing a separated fine tuning and a coarse tuning of the signal generator output frequency, it can be achieved that during a continuous transmission or receiving the signal generator output frequency can be fine adjusted and (only) during the guard periods can be coarse adjusted. By providing the coarse adjustment during the guard periods a transmission or receiving of RF-signals is not interrupted because the signal generator output signal 105 is continuously provided to the transmitter or the receiver during communication periods (such as transmission periods of the transmitter or receiving periods of the receiver)

Moreover, during these guard periods a transmitter may adjust a transmission power for transmitting the RF-signals and a receiver may adjust a gain for receiving the RF-signals.

According to further embodiments, the mismatch compensator 103 may comprise a fine tuning mode during which the mismatch compensator 103 provides the fine tuning signal 111 and a coarse tuning mode during which the mismatch compensator 103 provides the coarse tuning signal 113. The mismatch compensator 103 may be configured to either activate the fine tuning mode or the coarse tuning mode at a given time. In other words, the mismatch compensator 103 may either provide the fine tuning signal 111 or the coarse tuning signal 113 at a time. As an example, the mismatch compensator 103 may continuously provide the fine tuning signal 111 during transmission periods or receiving periods defined in the communication protocol and may provide the coarse tuning signal 113 during the guard periods in between the transmitting periods or receiving periods (in general in between the communication periods).

In other words, the mismatch compensator 103 may be configured to intermittently activate the coarse tuning mode during the guard periods defined in the given communication protocol. According to further embodiments, the mismatch compensator 103 may activate the coarse tuning mode only during the guard periods.

Figure 2:
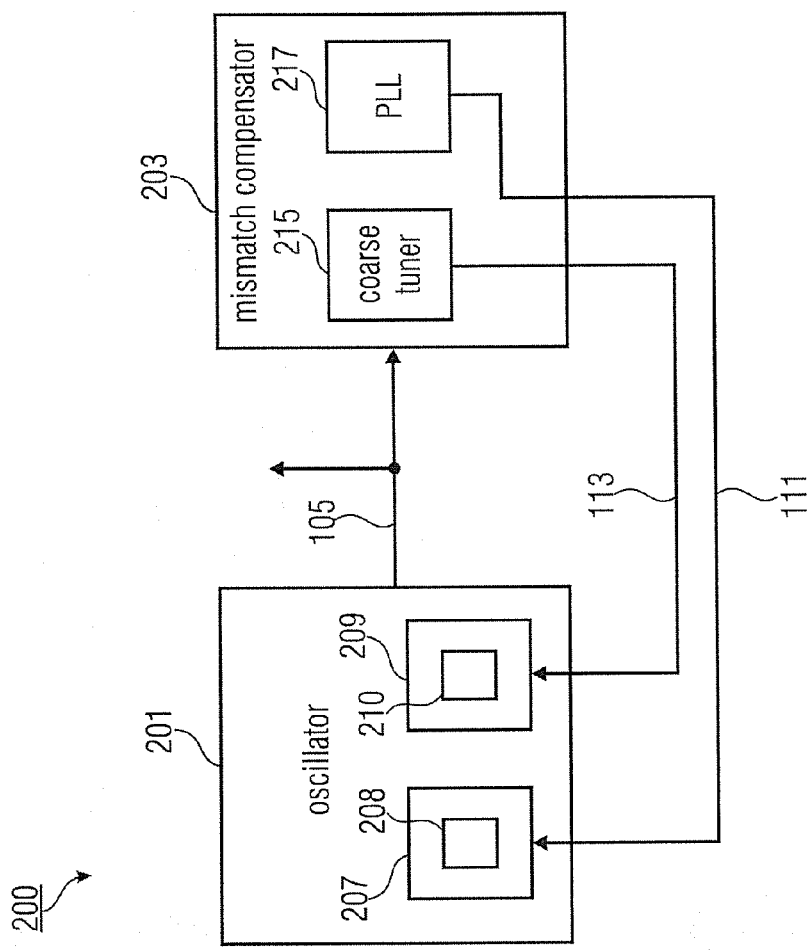
FIG. 2 shows a block schematic diagram of a signal generator according to a further embodiment.

FIG. 2 shows a block schematic diagram of a signal generator 200 according to a further embodiment.

A functionality of the signal generator 200 is similar to a functionality of the signal generator 100. The signal generator 200 comprises additional features shown in FIG. 2. Further embodiments may comprise one, some or all of the additional features shown in FIG. 2 when compared to the signal generator 100 according to FIG. 1.

The signal generator 200 differs from the signal generator 100 in that a mismatch compensator 203 of the signal generator 200 comprises a coarse tuner 215 and a phase locked loop (PLL) 217.

Furthermore, the signal generator 200 differs from the signal generator 100 in that the fine tuning circuit 207 of the oscillator 201 of the signal generator 200 comprises a first switchable tuning capacitor array 208 and in that the coarse tuning circuit 209 of the oscillator 201 comprises a second switchable tuning capacitor array 210.

The coarse tuner 215 is configured to provide the coarse tuning signal 113. The phase locked loop 217 is configured to provide the fine tuning signal 111. The phase locked loop 217 is further configured to track the signal generator output frequency and provide the fine tuning signal 111 during a transmission period during which a transmitter the signal generator 200 is comprised in transmits RF-signals or during a receiving period during which a receiver the signal generator 100 is comprised in receives RF-signals.

By providing the fine tuning signal 111 during transmission or receiving periods, it can be achieved that a mismatch of the signal generator output frequency is compensated during this transmission period or receiving period, while holding the phase locked loop 217 in a locked state. The phase locked loop 217 provides the fine tuning signal 111 such that, the signal generator output frequency changes in response to the fine tuning signal 111 and the PLL 217 stays in a locked state during the transmission periods or receiving periods. Therefore, it can be achieved that a transmission or a receiving is not interrupted because of an out of lock state of the phase locked loop 217.

By providing the coarse tuning signal 213 by the coarse tuner 215 during the guard periods, larger frequency jumps of the signal generator output frequency can be achieved than with the fine tuning signal 111. A frequency jump which is triggered by a coarse tuning signal 113 may lead to an out of lock state of the phase locked loop 217, which is not critical during a guard period, as in this guard period no RF-signals are transmitted by a receiver or no RF-signals are to be received by a receiver. A maximum frequency jump described by a coarse tuning signal from the coarse tuner 215 can be chosen such that a settling time of the phase locked loop 217 for reaching a locked state is smaller than the guard period defined in the given communication protocol.

In other words, the phase locked loop 217 is configured to provide the fine tuning signal 111 for changing the state of the fine tuning circuit 207 such that a frequency difference of the generator output signal 105 before the change of state of the fine tuning circuit 207 and after the change of state of the fine tuning circuit 207 is in a first predetermined frequency range, in which the phase locked loop 217 stays in a locked state.

The coarse tuner 215 is configured to provide the coarse tuning signal 113 for changing the state of the coarse tuning circuit 209, such that a frequency difference of the signal generator output signal 105 before the change of state of the coarse tuning circuit 209 and after the change of state of the coarse tuning circuit 209 is in a second predetermined range, in which a settling time for the phase locked loop 217 for reaching a locked state is at maximum equal to the guard period of the given communication protocol.

The phase locked loop 217 (PLL) tracks the frequency (and/or the phase) of the oscillator 201 (of the signal generator output signal 105) and corrects for any frequency errors, for example, caused by a thermal drift of the oscillator 201. In other words, the phase locked loop 217 is configured to continuously track the signal generator output frequency and continuously provide the fine tuning signal 111 during transmission periods or receiving periods of the given communication protocol, such that the state of the fine tuning circuit 207 is changed during a transmission period or during a receiving period.

Any correction (of the signal generator output frequency) to be applied needs a certain tuning range of the oscillator 201. In other words, for changing the signal generator output frequency, the fine tuning circuit 207 and the coarse tuning circuit 209 are used and controlled by the mismatch compensator 203. The coarse tuning signal 113 may apply to a certain tuning curve of the oscillator 201 and the fine tuning signal 111 may apply to a position on a chosen tuning curve of the oscillator 201. In other words, the frequency of the oscillator 201 (the signal generator output frequency) is controlled by selecting one out of N tuning curves at the time of switching on (coarse tuning). Once the phase locked loop 217 is locked, it is (the oscillator 201) continuously controlled by fine tuning in the selected tuning curve.

A tuning curve of the oscillator 201 may also be designated as the DCO tuning curve or the DCO curve.

Figure 3A:
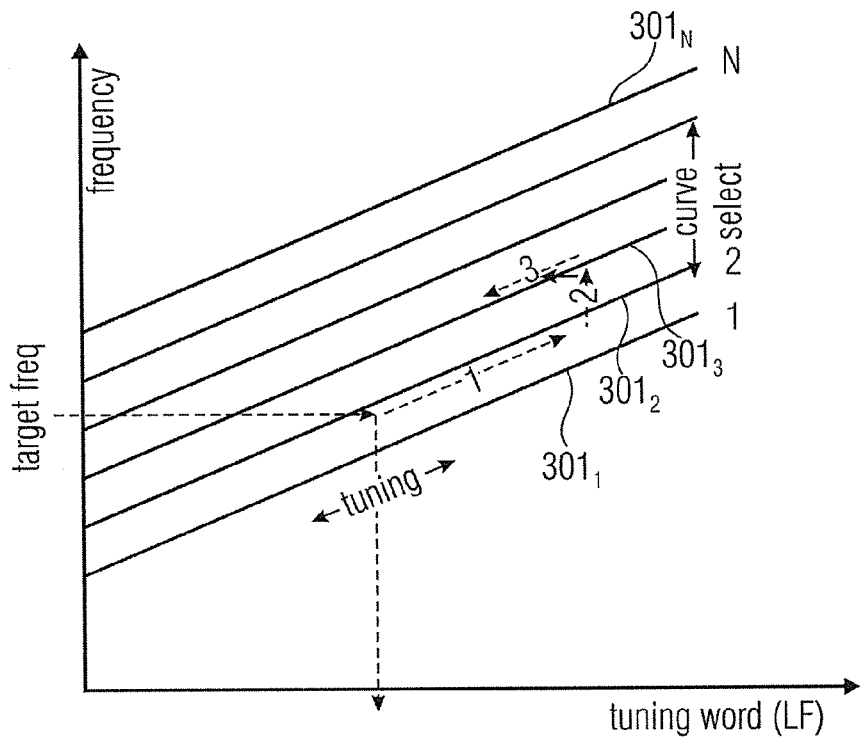
FIG. 3a shows in a diagram different tuning curves which may be employed in a signal generator according to an embodiment for changing the signal generator output frequency.

FIG. 3a shows in a diagram, as an example, different tuning curves $301_1$ to $301_N$ (for example of the oscillator 201). The x axis of the diagram corresponds to a tuning word (LF). This tuning word is provided by the phase locked loop 217 as the fine tuning signal 111. The y axis of the diagram corresponds with the signal generator output frequency generated by the oscillator 201. Each of the tuning curves $301_1$ to $301_N$ corresponds to a value of the coarse tuning signal 113.

It has been found that a tuning range (determined by the fine tuning circuit 207 or the maximum capacitance of the first switchable tuning capacitor array 208) of a single tuning curve $301_1$ to $301_N$ is limited by several factors:

The maximum possible capacitance (of the first switchable tuning capacitor array 208) is limited by chip area restrictions.

The number of switches (of the first switchable tuning capacitor array 208) introduces a parasitic capacitance which limits the minimum possible capacitance (of the smallest capacitor of the first switchable tuning capacitor array 208).

The more switching devices (the more capacitors inside the first switchable tuning capacitor array 208), the more noise is introduced into the system. In other words, with an increasing number of capacitances in the first switchable tuning capacitor array 208, an increasing amount of noise is introduced into the oscillator 201.

The more tuning devices (inside the fine tuning circuit 207), the more current is needed to drive them.

A system design has to cope with these limitations. Embodiments cope with this limitation by separating the tuning of the signal generator output signal 105 in fine tuning by the fine tuning circuit 207 and coarse tuning by the coarse tuning circuit 209.

The coarse tuning (applied by the coarse tuning circuit 209) is not subject to the limitations due to a higher and less accurate frequency step size between adjacent tuning curves (as shown in FIG. 3a). The phase locked loop 217 would get immediately out of lock if it was switched to a new tuning curve during operation. It has been found that if a change of tuning curves is applied (only) during the guard periods of the given communication protocol, the out of lock state of the phase locked loop 217 does not influence a communication, as during these guard periods no communication happens. Therefore, in embodiments tuning curves are switched during the guard periods, or in other words, the coarse tuning signal 113 (for switching a tuning curve) is provided during the guard periods. By providing the fine tuning signal 111 as a position on a tuning curve during the transmission periods or the receiving periods and by providing the coarse tuning signal 113 for switching the tuning curves during the guard periods, a large tuning range of the oscillator 201 can be achieved.

Embodiments allow abandoning the most part of the thermal drifts effect when defining the required tuning range.

In the following the characteristics of the signal generator 200 will be described in more detail using the FIGS. 3a and 3b.

An oscillator characteristic (e.g. of the oscillator 201) is shown in FIG. 3a. It consists of the N tuning curves $301_1$ to $301_N$. The tuning curve closest to the target frequency at the middle of the tuning word (LF—defined by the fine tuning signal 111 by the phase locked loop 217) is selected prior to the locking process (of the phase locked loop 217). The phase locked loop 217 settles to the desired frequency during the locking process using the tuning word (by providing the tuning signal 111). Once the phase locked loop 217 is locked, the active transmit/receive operation can start. Any change in supply voltage and temperature leading to a frequency change will be corrected by the phase locked loop 217 (within the tuning range of the fine tuning circuit 207). If the tuning limit of the selected tuning curve (or DCO-curve) is reached, the operation may get out of lock.

According to an embodiment, the mismatch compensator 203 may monitor the LF values (the fine tuning signal 111) and select another tuning curve (for example switch from a current tuning curve $301_2$ to a new tuning curve $301_3$) by providing an associated coarse tuning signal 113 (by the coarse tuner 215). The selection of the new tuning curve $301_3$ (arrow 2 in FIG. 3a) will result in an instantaneous frequency jump, which will be corrected by the phase locked loop 217 (arrow 3) by providing the fine tuning signal 111 for the fine tuning circuit 207. The new selected tuning curve $301_3$ can tune to higher frequencies (by changing the state of the fine tuning circuit 207) than the used curve $301_2$ before.

The remaining problem, which is solved by embodiments is that the system does not allow for any frequency jumps during the active operation (for example during a transmission period or a receiving period). But it is found that there are periods of times, the so-called guard periods, where the transmission and the receiving of data are shortly interrupted and the transmission power or a receive gain can be adjusted to another level (for a transmitter or a receiver). As an example, this period is a maximum of 50 ms long in an UMTS system. Therefore, the settling requirement for the phase locked loop is a portion of 50 ms.

Figure 3B:
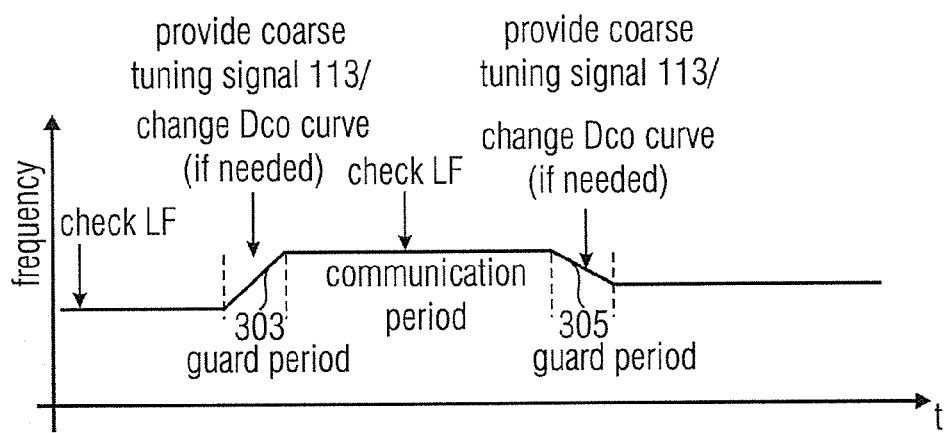
FIG. 3b shows a diagram illustrating how a mismatch compensator comprised in a signal generator according to an embodiment provides the coarse tuning signals.

The solution is to align the selection of the new tuning curve to this guard period as depicted in FIG. 3b. In the diagram in FIG. 3b the signal generator output frequency is shown in dependence on the time t, wherein the signal generator output frequency is changed during a first guard period 303 (for example from a first tuning curve $301_1$ to a third tuning curve $301_3$). During a second guard period 305, the signal generator output frequency is changed again (for example from the third tuning curve $301_3$ to a second tuning curve $301_2$). Between subsequent guard periods, the communication protocol may comprise communication periods (for example transmission periods or receiving periods) during which a transmitter or a receiver transmits or receives RF-signals. The mismatch compensator 203 may intermittently check (for example during the communication period) if the fine tuning signal 111 is liable to leave a given fine tuning range of the fine tuning circuit 207 and to schedule providing a coarse tuning signal 113 (for changing the tuning curve) for a following guard period (for example for the next guard period). The mismatch compensator 203 may then intermittently activate the coarse tuning mode during the guard periods defined in the given communication protocol, during which no RF-signals are transmitted by the transmitter or no RF-signals are to be received by the receiver for providing the coarse tuning signal 113 for changing the tuning curve (if needed).

According to an embodiment, the mismatch compensator 203 may check if the tuning word for tuning the fine tuning circuit 207 fulfils a predetermined condition (for example if it has more than 70%, 80%, 90% or 95%, of its maximum value) and may then schedule providing the coarse tuning signal 113 for the following guard period. By this mechanism it can be prevented that the tuning curve is changed before the maximum tuning range of the fine tuning circuit 207 is reached, to prevent reaching a tuning limit of the fine tuning circuit 207 during a communication period, as in this case during this communication period no further fine tuning of the signal generator output frequency would be possible anymore.

Furthermore, the mismatch compensator 203 may schedule providing the coarse tuning signal 113 independent of whether or not the signal generator output frequency generated by the oscillator 201 matches the desired signal generator output frequency. In other words, the mismatch compensator 203 may even provide the coarse tuning signal 113 for changing the state of the coarse tuning circuit 209 (or for changing the tuning curve) if the signal generator output frequency matches the desired signal generator output frequency, but the tuning word for tuning the fine tuning circuit 207 is liable to leave the fine tuning range of the fine tuning circuit 207. As an example, the tuning curve may be changed such that after the change of the tuning curve, the fine tuning circuit 107 is in the middle of its fine tuning range, therefore, achieving an optimal tuning range for upcoming (non predictable) frequency drifts caused by temperature or voltage changes.

According to further embodiments the mismatch compensator 203 may be configured to check the tuning word intermittently after predefined time periods and/or after a predefined variation of a temperature and/or a supply voltage of the signal generator 200. In other words, the mismatch compensator 203 may survey a temperature and/or a supply voltage of the signal generator 200 and may schedule in response to a given temperature or supply voltage difference providing a coarse tuning signal 113 for a following guard period.

According to further embodiments, the mismatch compensator 203 may measure a relative temperature difference, for example, compared to the temperature at which the last tuning curve change happened.

The benefit of this volt and correct mechanism is, that the term drift is corrected in the real application and has not to be included in the tuning range along each curve, which allows to significantly reduce the capacitance array, for example for implementing a DVO design.

According to further embodiments, the oscillator 201 may be a digitally controlled oscillator (DCO). Therefore, the coarse tuning signal 113 and the fine tuning signal 111 received by the digitally controlled oscillator may be digital signals, wherein the fine tuning signal 111 describes which capacitors of the first switchable tuning capacitor array 208 have to be switched on and the coarse tuning signal 113 describes which capacitors of the second switchable tuning capacitor array 210 have to be switched on.

Therefore, the mismatch compensator 203 may provide the coarse tuning signal 113 and the fine tuning signal 111 as digital signals in one embodiment. The phase locked loop 217 may be a digital phase locked loop, which determines a phase difference between the signal generator output signal 105 and a reference clock signal and which generates, in dependence of the phase difference, the fine tuning signal 111 as a digital signal for switching on and off capacitors of the first switchable tuning capacitor array 208.

As mentioned before, the fine tuning signal 111 may define which capacitors are to be switched on in the first switchable tuning capacitor array 208 in response to the reception of the fine tuning signal 111. The coarse tuning signal 113 may define which capacitors are to be switched on in the second switchable tuning capacitor array 210 in response to the reception of the coarse tuning signal 113. Therefore, the state of the fine tuning circuit 207 and the capacitors switched on in the first switchable tuning capacitor array 208 may change during a communication period and, therefore, during a transmission or receiving of a RF-signals of a transmitter or a receiver in which the signal generator 200 is employed. A state of the coarse tuning circuit 209 and the capacitors switched on in the second switchable tuning capacitor array 210 is constant during such a communication period and may change during the guard periods defined in the given communication protocol.

A capacitance of a smallest switchable tuning capacitor of the second switchable tuning capacitor array 209 may be chosen such that a maximum capacitance of the first switchable tuning capacitor array 208 is at maximum 2 times, 4 times, 6 times, or 8 times the capacitance of the smallest capacitor of the second switchable tuning capacitor array 209. By choosing the maximum capacitance of the first switchable tuning capacitor array 208 smaller than a maximum capacity of the second switchable tuning capacitor array 209, it can be achieved that the phase locked loop 217 stays locked during a change of capacitance of the first switchable tuning capacitor array 208. Furthermore, a large tuning array can be achieved by additionally having the second switchable tuning capacitor array 210 (having a larger maximum capacity than the first switchable tuning capacitor array 208).

According to further embodiments, a capacitance of a smallest switchable tuning capacitor of the first switchable tuning capacitor array 208 is chosen such that a minimum switchable frequency difference of the signal generator output frequency is at maximum 0.5%, 1%, 2% or 5% of a maximum signal generator output frequency.

As mentioned before, similar to the guard period of the transmitter, a period for a receiver exists, which is used for gain adjustment. According to further embodiments, the method of the oscillator temperature range extension can be different for a signal generator used in a transmitter than for a signal generator used in a receiver.

As an example, instead of monitoring the tuning word, the temperature is periodically checked (for example using an internal or external temperature sensor). If the temperature change is significant (for example bigger than a predefined threshold), then the new tuning curve is selected. Again, the selection of the new curve is aligned in time to the RX gain adjustment event (to the guard period of the receiver).

In the following, some aspects of the signal generator 200 shall be summarized.

The signal generator 200 provides a mismatch compensator 203 (or a PLL 217) with N tuning curves and a closed loop control within a selected tuning curve.

An initial tuning curve is selected in the way that a sufficient frequency control range is available to compensate for a frequency drift during closed loop operation (during provision of the fine tuning signal 111). During operation, the position on the tuning curve is regularly monitored with regard to the remaining tuning range in order to prevent the phase locked loop 217 from reaching the upper or lower tuning limit (determined by the fine tuning range of the fine tuning circuit 207). According to further embodiments, the phase locked loop 217 is part of a transmitter or receiver system (for example, a modulator/demodulator LO (Local Oscillator)) with short guard periods during which the transmission of data is interrupted. In general, during these guard periods, a new tuning curve is selected if the remaining tuning range on either side falls below a minimum threshold (for example if the first switchable tuning capacitor array 208 is liable to reach its minimum capacitance or its maximum capacitance).

For detecting the remaining tuning range, the mismatch compensator 203 may monitor the LF tuning word (the fine tuning signal 111) which characterizes the position on a tuning curve.

According to further embodiments, the mismatch compensator 203 may monitor the chip temperature and/or the supply voltage and may in response to a given temperature difference or supply voltage difference schedule providing a coarse tuning signal for a following guard period.

According to further embodiments, the mismatch compensator 203 may monitor the LF value after predefined time periods and/or a predefined variation of the chip temperature and/or supply voltage, instead of continuously monitoring the LF value. Therefore, the CPU (Central Processing Unit) time for monitoring the LF value can be minimized.

For selecting the DCO tuning curve, the mismatch compensator 203 may repeat the selection process of the tuning curve as used when switching on the phase locked loop 217. As an example, during a change of state of the coarse tuning circuit 209, the state of the fine tuning circuit 207 may remain constant and the PLL 217 may be configured to compensate for a frequency mismatch between the desired signal generator output frequency and the signal generator output frequency generated by the oscillator 201 after the change of state of the coarse tuning circuit 209 by providing a fine tuning signal 111 for adjusting the state of the fine tuning circuit 207 to the new state of the coarse tuning circuit 209. In other words, the phase locked loop 217 may correct for a frequency mismatch which occurs because of the change of state of the coarse tuning circuit 209 by providing the fine tuning signal 111 for the fine tuning circuit 207.

According to further embodiments, the mismatch compensator 203 may modify the initial selection process for the tuning curve to shorten the settling time of the phase locked loop 217. If the initial process is based on a successive approximation method, the value of the previously used tuning curve may be used as a start point.

It has been found that the initial tuning curve selection generally takes longer (for example by successive approximation) than an available guard period. Therefore, the mismatch compensator 203 may be configured to switch the tuning curve only once per guard period and to keep the frequency jump small in order not to exceed the limited guard period time for PLL settling.

As an example, the mismatch compensator 203 may employ the following specific method to shorten the settling time after changing the tuning curve:

The number of the selected tuning curve is called CT_VAL:

change from curve CT_VAL to CT_VAL+CT_STEP or CT_VAL-CT_STEP dependent on the required direction modify the stepsize CT_STEP dependent on the previous value CT_VAL by using a lookup table (beneficial, e.g., in case of non equidistant or non monotonic turning curves).

In other words, the coarse tuner 215 may provide the coarse tuning signal 113 for changing the state of the coarse tuning circuit 209 based on the current state of the coarse tuning circuit 209.

As an example, the coarse tuner 215 may be configured to provide the coarse tuning signal 113 such that during a change of the state of the coarse tuning circuit 209 (or during a change of the tuning curve), a given number of states (or a given number of tuning curves) between the current state (the current tuning curve) and a next state (a next tuning curve) is skipped. The coarse tuner 215 may be configured to select a maximum number of states (a maximum number of tuning curves) to be skipped based on the current state (on the current tuning curve) of the coarse tuning circuit 209, such that for each change of state (for each change of tuning curve) of the coarse tuning circuit 209, the settling time for the phase locked loop 217 is at maximum equal to (or is smaller than) the guard period.

According to further embodiments, the oscillator 101 or the oscillator 201, may be configured to provide the signal generator output signal 105 such that the signal generator output frequency is in a range from 100 MHz to 10 GHz or in a range from 500 MHz to 5 GHz or a in range from 700 MHz to 2700 MHz.

Figure 4:
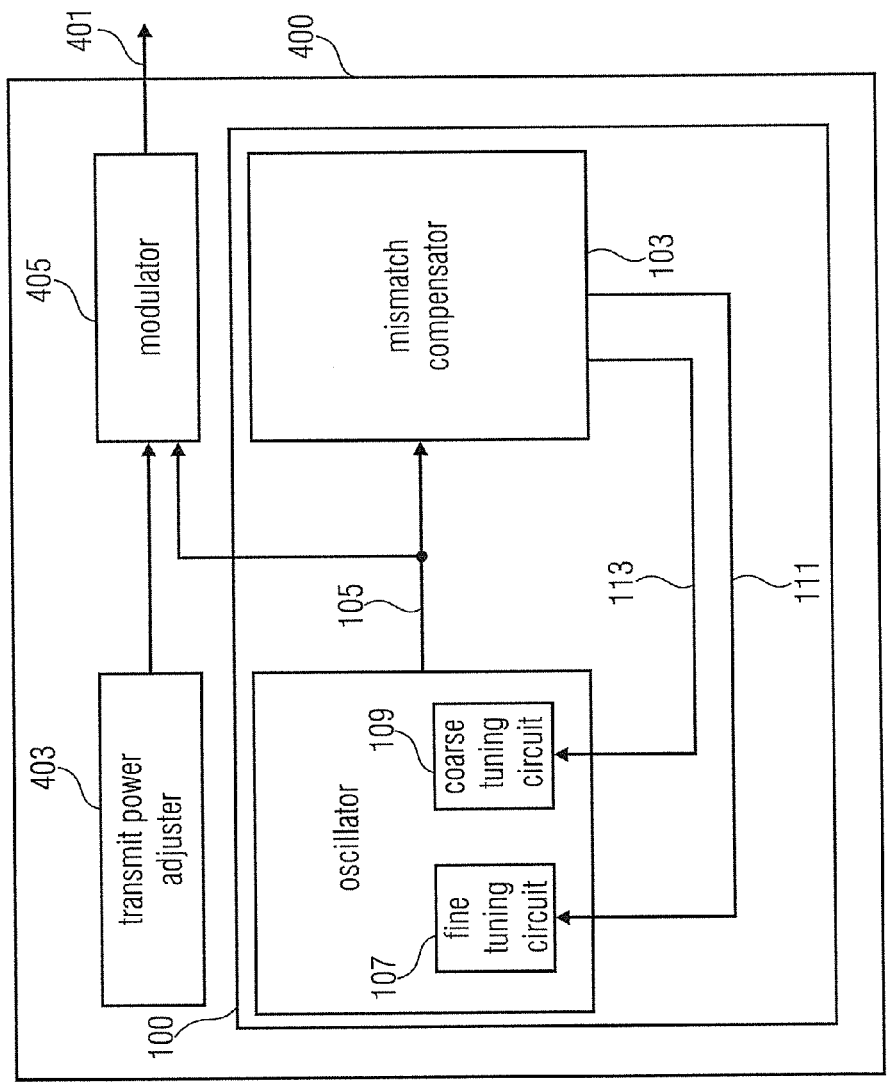
FIG. 4 shows a block schematic diagram of a transmitter according to an embodiment.

FIG. 4 shows a block schematic diagram of a transmitter 400 according to an embodiment. The transmitter 400 is configured to transmit RF-signals 401 according to a given communication protocol. The transmitter 400 comprises the signal generator 100. Furthermore, the transmitter 400 comprises a transmit power adjuster 403 and a modulator 405. The transmit power adjuster 403 is configured to adjust during the guard period of the given communication protocol a transmit power for transmitting the RF-signals 401. The modulator 405 is configured to provide the RF-signals 401 based on the signal generator output signal 105. According to further embodiments the signal generator 100 may be extended by one, some or all of the features of the signal generator 200.

The signal generator output signal 105 or a signal derived from this signal generator output signal 105 may be used by the modulator 405 to mix a base band signal to a desired carrier frequency to receive the RF-signals 401 at the desired carrier frequency.

By providing the coarse tuning signal 113 during the guard period, in which the transmit power adjuster 403 adjusts the transmit power for transmitting the RF-signals 401, the signal generator output frequency can be compensated for coarse frequency mismatches without interrupting a transmission of the RF-signals 401. The fine adjustment of the signal generator output frequency may be continuously performed by the mismatch compensator 103 during a transmission of the RF-signals 401.

According to further embodiments, the transmitter 400 may be configured to transmit the RF-signals 401 according to a UMTS or LTE communication protocol in a frequency division duplexing (FDD) mode.

Figure 5:
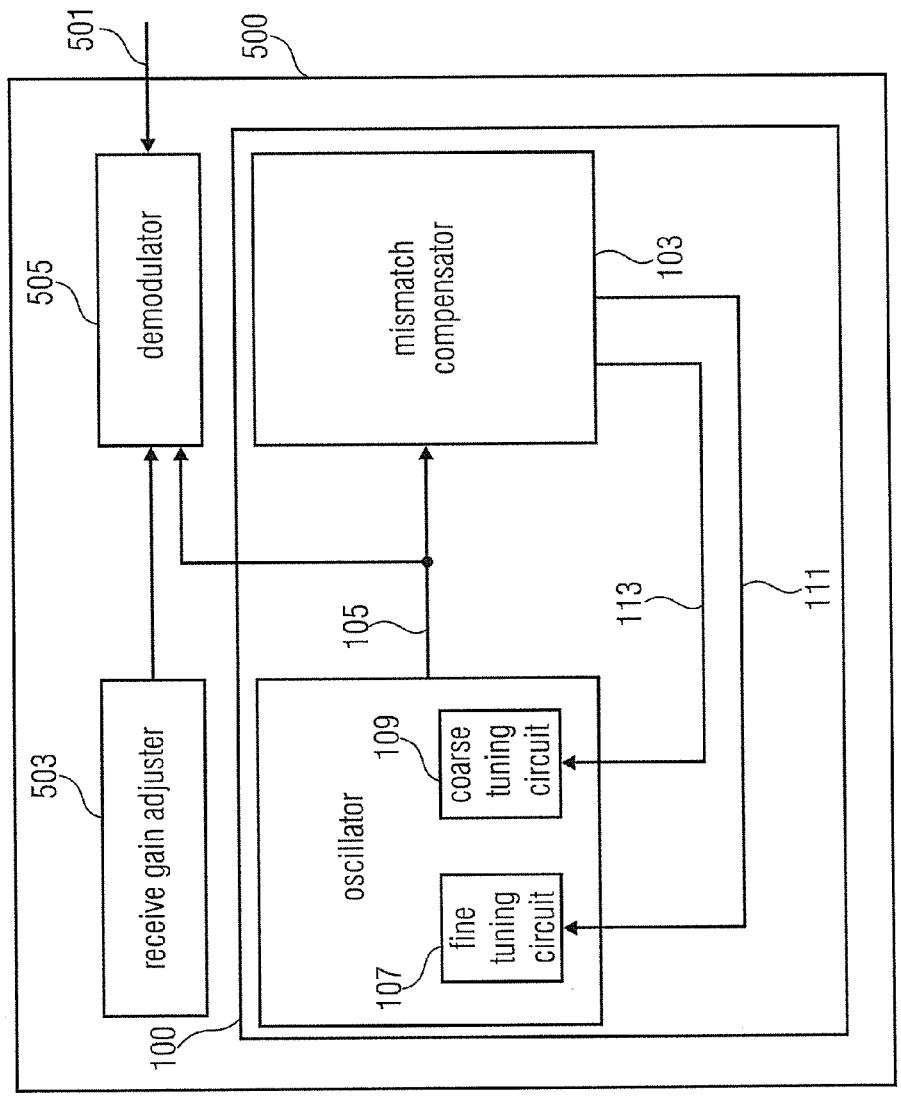
FIG. 5 shows a block schematic diagram of a receiver according to an embodiment.

FIG. 5 shows a block schematic diagram of a receiver 500 according to an embodiment. The receiver 500 is configured to receive RF-signals 501 according to a given communication protocol. The receiver 500 comprises the signal generator 100. Furthermore, the receiver 500 comprises a receive gain adjuster 503 and a demodulator 505. The receive gain adjuster 503 is configured to adjust during the guard period of the given communication protocol a receive gain for receiving the RF-signals 501. The demodulator 505 is configured to demodulate the RF-signals 501 based on the signal generator output signal 105.

According to further embodiments, the signal generator 100 may be extended by one, some or all of the features of the signal generator 200.

The demodulator 505 may provide a base band signal by down mixing the RF-signals 501 using the signal generator output signal 105 or a signal derived from the signal generator output signal 105 as the receive carrier signal.

By providing the coarse tuning signal 113 for a coarse adjustment of the signal generator output frequency during the guard period a coarse adjustment of the signal generator output frequency is possible without losing any RF-signals 501 which are to be received by the receiver 500, as during the guard periods no RF-signals are to be received by the receiver 500.

According to further embodiments the receiver 500 may be configured to receive the RF-signals 501 according to a UMTS or LTE communication protocol in a frequency division duplexing (FDD) mode.

Figure 6:
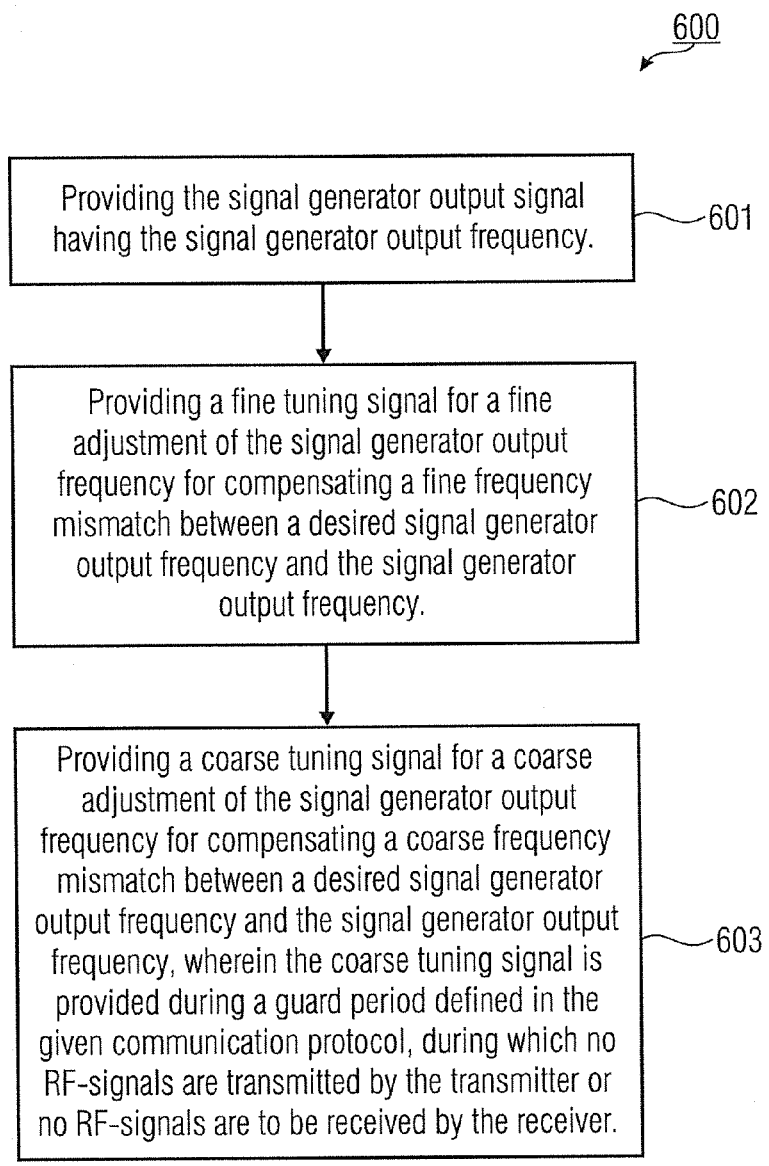
FIG. 6 shows a flow diagram of a method according to an embodiment.

FIG. 6 shows a flow diagram of a method 600 for generating a signal generator output signal, the signal generator output signal having a signal generator output frequency, for a transmitter for transmitting RF-signals or for a receiver for receiving RF-signals according to a given communication protocol.

The method 600 comprises a step 601 of providing the signal generator output signal having the signal generator output frequency.

Furthermore, the method 600 comprises a step 602 of providing a fine tuning signal for a fine adjustment of the signal generator output frequency for compensating a fine frequency mismatch between a desired signal generator output frequency and the signal generator output frequency.

Furthermore, the method 600 comprises a step 603 of providing a coarse tuning signal for a coarse adjustment of the signal generator output frequency for compensating a coarse frequency mismatch between a desired signal generator output frequency and the signal generator output frequency, wherein the coarse tuning signal is provided during a guard period defined in the given communication protocol, during which no RF-signals are transmitted by the transmitter or no RF-signals are to be received by the receiver.

An order of the steps 602, 603 is arbitrary.

In the following, some aspects of the embodiments will be summarized.

The request for a higher tuning range of an oscillator is driven by several factors and thermal frequency drift is among the dominant ones. Embodiments have significant advantages over alternate solutions in which it is tried to reduce or compensate the thermal drift effects of the device (e.g. of a frequency synthesizer) as thermal drift effects are very difficult to reduce over a large temperature range. Instead of reducing the thermal drift effects, embodiments compensate the frequency mismatch occurring by the thermal drift effect.

Furthermore, embodiments have a significant advantage over alternate solutions in which the tuning range is extended and therefore one has to cope with the increase of noise and power consumption. Embodiments provide an increased tuning range by separating the tuning of the signal generator output signal using a fine tuning circuit and a coarse tuning circuit and by providing coarse tuning signals during guard periods of a given communication protocol.

Embodiments are applicable in oscillators, for example used for 3G systems (UMTS).

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the non-transitory digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a non-transitory machine readable carrier.

Other embodiments comprise the computer program for performing one of the methods described herein, stored on a non-transitory machine readable carrier.

In other words, an embodiment of the inventive method is, therefore, a computer program having a program code for performing one of the methods described herein, when the computer program runs on a computer.

A further embodiment of the inventive methods is, therefore, a non-transitory data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A signal generator for a transmitter or a receiver for transmitting or receiving RF-signals according to a given communication protocol, respectively, the signal generator comprising:
   an oscillator configured to provide a signal generator output signal having a signal generator output frequency, the oscillator comprising a fine tuning circuit configured to provide a fine adjustment of the signal generator output frequency based on a fine tuning signal, and a coarse tuning circuit configured to provide a course adjustment of the signal generator output frequency based on a coarse tuning signal; and
   a mismatch compensator configured to receive the signal generator output signal and compensate a frequency mismatch between a desired signal generator output frequency and the signal generator output frequency generated by the oscillator by providing the fine tuning signal for changing a state of the fine tuning circuit of the oscillator and by providing the coarse tuning signal for changing a state of the coarse tuning circuit of the oscillator, wherein the mismatch compensator is configured to provide the coarse tuning signal during a guard period defined in the given communication protocol, during which no RF-signals are transmitted by the transmitter or no RF-signals are to be received by the receiver, such that the state of the coarse tuning circuit is changed within the guard period.

2. The signal generator according to claim 1,
   wherein the mismatch compensator comprises a fine tuning mode during which the mismatch compensator provides the fine tuning signal and a coarse tuning mode during which the mismatch compensator provides the coarse tuning signal; and
   wherein the mismatch compensator is configured to either activate solely the fine tuning mode or the coarse tuning mode at a given time.

3. The signal generator according to claim 2,
   wherein the mismatch compensator is configured to intermittently activate the coarse tuning mode during the guard periods defined in the given communication protocol, during which no RF-signals are transmitted by the transmitter or no RF-signals are to be received by the receiver.

4. The signal generator according to claim 1,
   wherein the mismatch compensator is configured to intermittently check if the fine tuning signal is liable to leave a given fine tuning range of the fine tuning circuit based on predetermined criteria and, if so, to then schedule providing a coarse tuning signal for a following guard period.

5. The signal generator according to claim 4,
   wherein the mismatch compensator is configured to schedule providing the coarse tuning signal independent of whether or not the signal generator output frequency generated by the oscillator matches the desired signal generator output frequency.

6. The signal generator according to claim 4,
   wherein the mismatch compensator is configured to check if a tuning word for tuning the fine tuning circuit, the tuning word being comprised in the fine tuning signal, fulfills a predetermined condition and, if so, then schedule providing the coarse tuning signal for the following guard period.

7. The signal generator according to claim 6,
   wherein the mismatch compensator is configured to check the tuning word intermittently after a predefined time period and/or after a predefined variation of a temperature and/or based on a supply voltage of the signal generator.

8. The signal generator according to claim 4,
   wherein the mismatch compensator is configured to survey a temperature or a supply voltage of the oscillator and schedule providing the coarse tuning signal for the following guard period, if a temperature difference between a last check and a current check of the temperature or a supply voltage difference between a last check and a current check of the supply voltage fulfills a predetermined condition.

9. The signal generator according to claim 1,
   wherein the mismatch compensator comprises a coarse tuner configured to provide the coarse tuning signal and a phase locked loop configured to provide the fine tuning signal; and
   wherein the phase locked loop is configured to track the signal generator output frequency and provide the fine tuning signal during a transmission period defined in the given communication protocol, during which the transmitter transmits RF-signals or during a receiving period, defined in the given communication protocol, during which the receiver receives RF-signals.

10. The signal generator according to claim 9,
    wherein the phase locked loop is configured to continuously track the signal generator output frequency and to continuously provide the fine tuning signal during the transmission period or the receiving period, such that the state of the fine tuning circuit is changed during the transmission period or during the receiving period.

11. The signal generator according to claim 9,
    wherein the phase locked loop is configured to provide the fine tuning signal for changing the state of the fine tuning circuit such that a frequency difference of the generator output frequency before the change of state of the fine tuning circuit and after the change of state of the fine tuning circuit is in a first predetermined frequency range, in which the phase locked loop stays in a locked state.

12. The signal generator according to claim 9,
wherein the coarse tuner is configured to provide the coarse tuning signal for changing the state of the coarse tuning circuit such that a frequency difference of the generator output frequency before the change of state of the coarse tuning circuit and after the change of state of the coarse tuning circuit is in a second predetermined frequency range, in which a settling time for the phase locked loop to enter a locked state is at maximum equal to the guard period.

13. The signal generator according to claim 9,
wherein the coarse tuner is configured to provide the coarse tuning signal for changing the state of the coarse tuning circuit based on a current state of the coarse tuning circuit.

14. The signal generator according to claim 13,
wherein the coarse tuner is configured to provide the coarse tuning signal such that during a change of state of the coarse tuning circuit from the current state to a next state a given number of states between the current state and the next state is skipped; and
wherein the coarse tuner is configured to select a maximum number of states to be skipped based on the current state of the coarse tuning circuit, such that for each change of state of the coarse tuning circuit the settling time for the phase locked loop is at maximum equal to the guard period.

15. The signal generator according to claim 9,
wherein the mismatch compensator is configured to provide the fine tuning signal and the coarse tuning signal such that, during the change of state of the coarse tuning circuit the state of the fine tuning circuit remains constant; and
wherein the phase locked loop is configured to compensate for a frequency mismatch between the desired signal generator output frequency and the signal generator output frequency generated by the oscillator after the change of state of the coarse tuning circuit by providing the fine tuning signal for adjusting the state of the fine tuning circuit in accordance with a new state of the coarse tuning circuit.

16. The signal generator according to claim 1,
wherein the fine tuning circuit comprises a first switchable tuning capacitor array;
wherein the coarse tuning circuit comprises a second switchable tuning capacitor array;
wherein the fine tuning signal defines which capacitors are to be switched on in the first switchable tuning capacitor array in response to a reception of the fine tuning signal; and
wherein the coarse tuning signal defines which capacitors are to be switched on in the second switchable tuning capacitor array in response to a reception of the coarse tuning signal.

17. The signal generator according to claim 16,
wherein a capacitance of a smallest switchable tuning capacitor of the second switchable tuning capacitor array is chosen such that a maximum capacitance of the first switchable tuning capacitor array is at maximum eight times the capacitance of the smallest capacitor of the second switchable tuning capacitor array.

18. The signal generator according to claim 1,
wherein different states of the coarse tuning circuit correspond to different tuning curves;
wherein the coarse tuning signal defines a currently active tuning curve from the different tuning curves; and
wherein the fine tuning signal defines a position on the currently active tuning curve.

19. A transmitter for transmitting RF-signals according to a given communication protocol, the transmitter comprising:
a signal generator comprising:
an oscillator configured to provide a signal generator output signal having a signal generator output frequency, the oscillator comprising a fine tuning circuit configured to provide a fine adjustment of the signal generator output frequency based on a fine tuning signal and a coarse tuning circuit configured to provide a course adjustment of the signal generator output frequency based on a coarse tuning signal; and
a mismatch compensator configured to receive the signal generator output signal and compensate a frequency mismatch between a desired signal generator output frequency and the signal generator output frequency generated by the oscillator by providing the fine tuning signal for changing a state of the fine tuning circuit of the oscillator and by providing the coarse tuning signal for changing a state of the coarse tuning circuit of the oscillator, wherein the mismatch compensator is configured to provide the coarse tuning signal during a guard period defined in the given communication protocol, during which no RF-signals are transmitted by the transmitter such that the state of the coarse tuning circuit is changed within the guard period;
a transmit power adjuster, configured to adjust during the guard period a transmit power for transmitting the RF-signals; and
a modulator configured to provide the RF-signals based on the signal generator output signal.

20. The transmitter according to claim 19, wherein the transmitter is configured to transmit RF-signals according to a UMTS or LTE communication protocol in a frequency division duplexing mode.

21. A receiver for receiving RF-signals according to a given communication protocol, the receiver comprising:
a signal generator comprising:
an oscillator configured to provide a signal generator output signal having a signal generator output frequency, the oscillator comprising a fine tuning circuit configured to provide a fine adjustment of the signal generator output frequency based on a fine tuning signal and a coarse tuning circuit configured to provide a course adjustment of the signal generator output frequency based on a coarse tuning signal; and
a mismatch compensator configured to receive the signal generator output signal and compensate a frequency mismatch between a desired signal generator output frequency and the signal generator output frequency generated by the oscillator by providing the fine tuning signal for changing the state of the fine tuning circuit of the oscillator and by providing the coarse tuning signal for changing a state of the coarse tuning circuit of the oscillator, wherein the mismatch compensator is configured to provide the coarse tuning signal during a guard period defined in the given communication protocol, during which no RF-signals are to be received by the receiver, such that the state of the coarse tuning circuit is changed within the guard period;
a receive gain adjuster configured to adjust during the guard period a receive gain for receiving the RF-signals; and
a demodulator configured to demodulate the RF-signals based on the signal generator output signal.

22. The receiver according to claim 21, wherein the receiver is configured to receive RF-signals according to a UMTS or LTE communication protocol in a frequency division duplexing mode.

23. A method for generating a signal generator output signal, the signal generator output signal having a signal generator output frequency, for a transmitter for transmitting RF-signals or for a receiver for receiving RF-signals according to a given communication protocol, the method comprising:
provewritten the signal generator output signal having the signal generator output frequency;
providing a fine tuning signal for a fine adjustment of the signal generator output frequency for compensating a fine frequency mismatch between a desired signal generator output frequency and the signal generator output frequency; and
providing a coarse tuning signal for a coarse adjustment of the signal generator output frequency for compensating a course frequency mismatch between a desired signal generator output frequency and the signal generator output frequency, wherein the coarse tuning signal is provided during a guard period defined in the given communication protocol, during which no RF-signals are transmitted by the transmitter or no RF-signals are to be received by the receiver.

24. A non-transitory computer readable non transitory digital storage medium having stored thereon a computer program having a program code for performing, when running on a computer, the method according to claim 23.

25. A signal generator for a transmitter or a receiver for transmitting or receiving RF-signals according to a given communication protocol, the signal generator comprising:
an oscillator configured to provide a signal generator output signal having a signal generator output frequency, the oscillator comprising a fine tuning circuit configured to provide a fine adjustment of the signal generator output frequency based on a fine tuning signal and a coarse tuning circuit configured to provide a course adjustment of the signal generator output frequency based on a coarse tuning signal; and
a mismatch compensator configured to receive the signal generator output signal and compensate a frequency mismatch between a desired signal generator output frequency and the signal generator output frequency generated by the oscillator by providing the fine tuning signal for changing a state of the fine tuning circuit of the oscillator and by providing the coarse tuning signal for changing a state of the coarse tuning circuit of the oscillator, wherein the mismatch compensator is configured to provide the coarse tuning signal during a guard period defined in the given communication protocol, during which no RF-signals are transmitted by the transmitter or no RF-signals are to be received by the receiver, such that the state of the coarse tuning circuit is changed within the guard period;
wherein the mismatch compensator comprises a fine tuning mode during which the mismatch compensator provides the fine tuning signal and a coarse tuning mode during which the mismatch compensator provides the coarse tuning signal;
wherein the mismatch compensator is configured to either activate the fine tuning mode or the coarse tuning mode at a given time;
wherein the mismatch compensator is configured to intermittently activate the coarse tuning mode during the guard periods defined in the given communication protocol, during which no RF-signals are transmitted by the transmitter or no RF-signals are to be received by the receiver;
wherein the mismatch compensator is configured to intermittently check if the fine tuning signal is liable to leave a given fine tuning range of the fine tuning circuit based on predetermined criteria and, if so, to then schedule providing a coarse tuning signal for a following guard period;
wherein the mismatch compensator comprises a coarse tuner configured to provide the coarse tuning signal and a phase locked loop for providing the fine tuning signal;
wherein the phase locked loop is configured to track the signal generator output frequency and to provide the fine tuning signal during a transmission period defined in the given communication protocol, during which the transmitter transmits RF-signals or during a receiving period, defined in the given communication protocol, during which the receiver receives RF-signals;
wherein the phase locked loop is configured to continuously track the signal generator output frequency and continuously provide the fine tuning signal during the transmission period or the receiving period, such that the state of the fine tuning circuit is changed during the transmission period or during the receiving period;
wherein the phase locked loop is configured to provide the fine tuning signal for changing the state of the fine tuning circuit such that a frequency difference of the generator output frequency before the change of state of the fine tuning circuit and after the change of state of the fine tuning circuit is in a first predetermined frequency range, in which the phase locked loop stays in a locked state; and
wherein the coarse tuner is configured to provide the coarse tuning signal for changing the state of the coarse tuning circuit such that a frequency difference of the generator output frequency before the change of state of the coarse tuning circuit and after the change of state of the coarse tuning circuit is in a second predetermined frequency range, in which a settling time for the phase locked loop to enter a locked state is at maximum equal to the guard period.

* * * * *

UNITED STATES PATENT AND TRADEMARK OFFICE
CERTIFICATE OF CORRECTION

PATENT NO.       : 8,890,635 B2
APPLICATION NO.  : 13/019358
DATED            : November 18, 2014
INVENTOR(S)      : Alexander Belitzer et al.

It is certified that error appears in the above-identified patent and that said Letters Patent is hereby corrected as shown below:

In the Claims

Column 17, Claim 24, Line 27 Please replace "A non-transitory computer readable non transitory digital" with --A non-transitory computer readable digital--

Signed and Sealed this
Seventeenth Day of February, 2015

Michelle K. Lee
*Deputy Director of the United States Patent and Trademark Office*